United States Patent [19]

Cuautla

[11] Patent Number: 5,744,977
[45] Date of Patent: Apr. 28, 1998

[54] HIGH-FORCE SPRING PROBE WITH IMPROVED AXIAL ALIGNMENT

[75] Inventor: Larry A. Cuautla, Rancho Cucamonga, Calif.

[73] Assignee: Delaware Capital Formation, Inc., Wilmington, Del.

[21] Appl. No.: 732,976

[22] Filed: Oct. 16, 1996

Related U.S. Application Data

[63] Continuation of Ser. No. 360,273, Dec. 21, 1994, abandoned.

[51] Int. Cl.⁶ .................................................. G01R 31/02
[52] U.S. Cl. .................................. 324/761; 439/482
[58] Field of Search ........................ 324/754–764; 439/482, 219, 824, 700

[56] References Cited

U.S. PATENT DOCUMENTS

| | | | |
|---|---|---|---|
| 4,105,970 | 8/1978 | Katz | 324/761 |
| 4,438,397 | 3/1984 | Katz | 324/761 |
| 4,508,405 | 4/1985 | Damon et al. | 439/260 |
| 4,560,223 | 12/1985 | Cooney et al. | 439/387 |
| 4,724,383 | 2/1988 | Hart | 324/754 |
| 5,225,773 | 7/1993 | Richards | 324/754 |

*Primary Examiner*—Ernest F. Karlsen
*Assistant Examiner*—Russell M. Kobert
*Attorney, Agent, or Firm*—Christie, Parker & Hale, LLP

[57] ABSTRACT

A high-force spring probe comprises a hollow barrel, a plunger disposed for sliding axial travel within the barrel, a plunger tip outside of the barrel for contacting a unit under test, and a plunger bearing inside the plunger end of the barrel. The plunger includes an elongated intermediate section that extends between the tip and bearing section of the plunger. The barrel includes a crimped portion immediately inside the plunger end of the barrel that engages the bearing section, and retains the plunger in the barrel. A coil spring is disposed within the barrel between a terminal end of the barrel and the plunger bearing section. The spring has a diameter approximately matching equal to the inside diameter of the barrel. The plunger includes a reduced diameter spring control section that extends axially from the bearing section along the center of the spring. The spring control section of the plunger has an outside diameter that approximately matches an inside diameter of the spring. The spring extends a major length of the barrel inside diameter, in one embodiment at least 90 percent of the length of the barrel, and this long spring greatly increases the spring force applied by the spring and to the plunger.

22 Claims, 2 Drawing Sheets

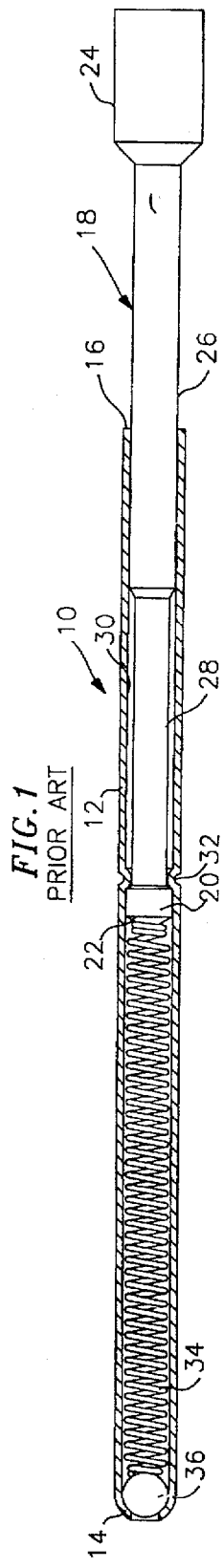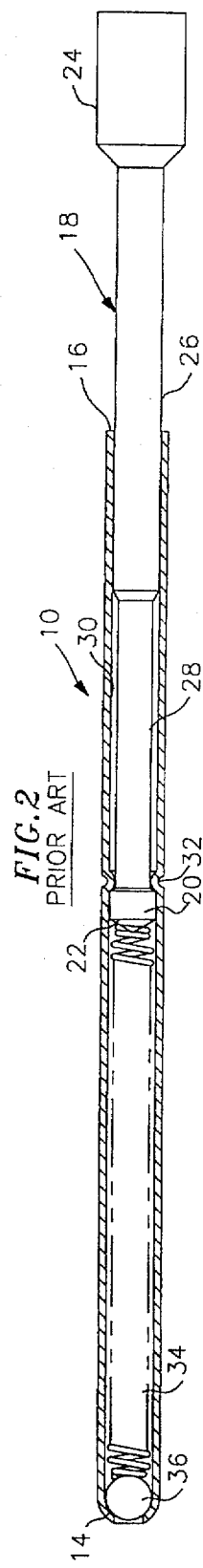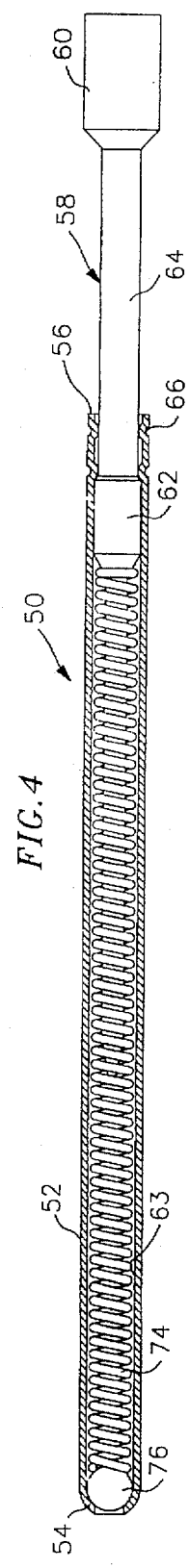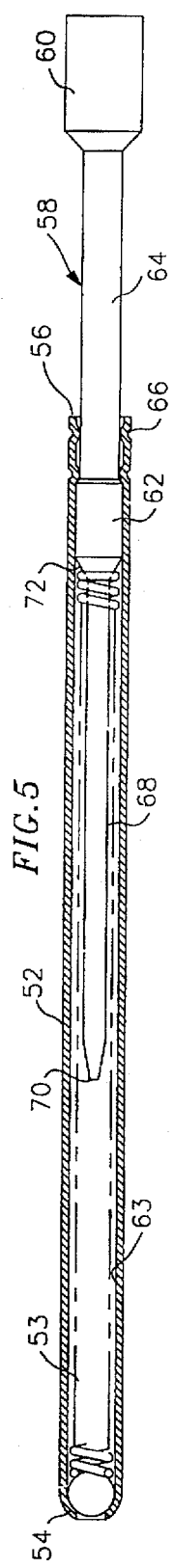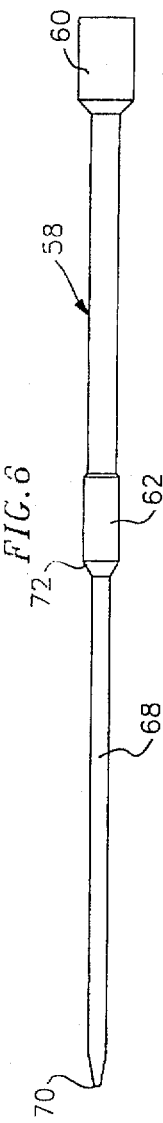

HIGH-FORCE SPRING PROBE WITH IMPROVED AXIAL ALIGNMENT

CROSS-REFERENCE TO RELATED APPLICATION

This is a continuation of application Ser. No. 08/360,273 filed Dec. 21, 1994, now abandoned.

FIELD OF THE INVENTION

The present invention relates to electrical contact probes and, more particularly, to spring-loaded contact probes used in electrical testing applications such as providing electrical contact between diagnostic or testing equipment and an electrical device under test.

BACKGROUND OF THE INVENTION

Conventional spring-loaded contact probes generally include an outer structure or barrel, a movable plunger that is slidably disposed within the barrel, and a spring within the barrel for biasing the reciprocating travel of the plunger in the barrel. A portion of the plunger is commonly biased outwardly away from the barrel a selected distance by the spring, and may be biased or depressed inwardly of the barrel, a selected distance, under force directed against the spring. The plunger generally includes a head portion or tip for contacting electrical devices under test. This includes contacting test points in circuits on a printed circuit board. Conventional contact probes that are used in electrical test applications on dirty or uncleaned printed circuit boards and the like are referred to as high-force spring probes, due to the use of springs with a high constant to impose a large spring force against the test points in the printed circuit board under test. A high spring force is desired to overcome the contaminant layer on the circuits or other electrical components on the board, to provide a good electrical contact between the plunger head and the board.

High-force spring probes are known in the art and include a barrel, a plunger partially disposed within the barrel, and a spring disposed within the barrel between an end portion of the plunger and a closed end of the barrel. The plunger has a first bearing portion at the plunger end adjacent the spring for extending radially a distance away from the plunger. The plunger also comprises a second bearing portion that extends radially away from the plunger near a center portion of the plunger. The barrel includes an inwardly extending crimp or the like which prevents the second bearing portion adjacent the spring from exiting the barrel. The plunger is guided and aligned within the barrel by interaction of the plunger bearings against the inside diameter surface of the barrel.

In conventional spring probes the barrel is mounted within a receptacle, with the plunger extending outwardly from the receptacle. Preferably, the barrel is removably mounted in the receptacle, so that should damage occur to the barrel or plunger, replacement is possible. Usually, the receptacle is permanently or semi-permanently mounted in an array within the tester. Electrical wiring may be attached to the receptacle, for electrical communication between the receptacle and the diagnostic and test equipment. Preferably, the probe, barrel and receptacle are manufactured from electrically conductive materials, so that an electrical circuit is maintained between the electrical device under test and test equipment, by means of the contact probe.

High-force spring probes that are constructed in the above-described manner impose only a limited amount of compression force against a dirty printed circuit board and, therefore, are of limited practical use for conducting reliable electrical tests on dirty boards. They also produce the necessary compression force at a high spring rate, i.e., the full compression force of the spring is achieved after only a small movement of the plunger. Both of these characteristics are due to the short length of spring that is used since the probe has only a limited amount of space within the barrel to accommodate locating the spring between the barrel and the plunger bearing. Accordingly, the use of such a shortened spring limits both the compression force imposed by the probe and operates at a high spring rate.

A high spring rate is not desirable because a relatively slight movement of the plunger within the barrel, upon contact of the plunger head or tip against a printed circuit board surface imposes the full compressive force onto the board, which may cause damage to the board or the plunger in the event a hard contaminant is lodged between the plunger and board. It has also been observed that the compression rate of the spring used in such a probe design is sometimes unpredictable due to the spring shaking or binding within the barrel during compression. Such movement of the spring within the barrel during operation makes use of the probe impractical in applications where a consistent compression force is required.

Additionally, such high-force spring probes are also known to display poor plunger axial alignment vis-a-vis the barrel due to both the relatively small plunger bearing surface areas and the relatively short axial distance between plunger bearing surfaces. The small bearing surface areas and short distance between plunger bearings can cause the plunger to move laterally or wobble within the barrel, making accurate placement of the plunger head on a test point difficult if not impossible.

Thus, there is a need for a high-force spring probe that imposes high spring forces on an electrical device or circuit under test, making use of the probe practical and reliable in applications where dirty electrical devices or circuits are to be tested. It is also desirable that a high-force spring probe be constructed in a manner that imposes high forces at a controlled spring rate. The high-force spring probe also should be constructed in a manner that provides accurate controlled axial travel of the plunger within the barrel, thereby ensuring high pointing accuracy of the plunger head on an electrical device or circuit under test.

SUMMARY OF THE INVENTION

Briefly, one embodiment of the invention comprises a high-force spring probe for placement within a probe receptacle for performing electrical tests on a unit under test. A high-force spring probe constructed according to principles of this invention includes a tubular barrel having a hollow interior extending therethrough, a plunger end at one end of the barrel, and a terminal end at an opposite end of the barrel. A plunger disposed within the hollow interior of the barrel is mounted for axial travel in the barrel. The plunger includes an exterior head or tip portion at one end for contact with an electrical device under test. The plunger also includes an elongated intermediate section arranged for sliding axial travel inside the barrel.

The barrel also includes at least one inwardly extending crimped portion positioned adjacent the plunger end of the barrel. The crimped portion has an inside diameter similar to the diameter of the intermediate plunger section to control sliding axial movement of the intermediate section in the barrel.

The plunger further includes a bearing section adjacent the intermediate section of the plunger and spaced remotely from the head or tip portion of the plunger. The bearing section extends radially outwardly from the plunger and is disposed within the barrel with a diameter greater than the diameter of the plunger intermediate section and approximately equal to the inside diameter of the barrel. This facilitates control of sliding axial travel of the plunger in the barrel. Outward travel of the plunger bearing section from the barrel interior is prevented by the bearing section contacting a stop inside the barrel.

A plunger control spring is disposed within the barrel between the terminal end of the barrel and the bearing section of the plunger. The spring has an outside diameter approximately equal in dimension to the inside diameter of the barrel. The spring is preferably a compression spring with an open inside region to accommodate a portion of the plunger described below. The plunger further includes an elongated reduced diameter spring control section disposed within the barrel that extends axially from the bearing section toward the terminal end of the barrel. The spring control section has a smaller diameter than the diameter of the plunger bearing section and is similar in dimension to an inside diameter of the spring to facilitate sliding axial travel of the spring control section inside the spring.

The action of the intermediate plunger section against the crimped barrel portions, the bearing section against the inside diameter of the barrel, and the outside diameter of the spring against the inside diameter of the barrel/spring control section against the inside diameter of the spring, each contributes to providing enhanced axial alignment and guidance of the plunger during axial travel within the barrel, thereby providing good pointing accuracy of the plunger during testing operations. Additionally the spring probe constructed in this manner provides a high spring force, due to the extended length of the spring within the barrel, and provides a constant spring rate, due to the interaction of the spring control section and the spring promoting aligned spring displacement within the barrel.

BRIEF DESCRIPTION OF THE DRAWINGS

These and other features and advantages of the present invention will become appreciated as the same becomes better understood with reference to the specification, claims and drawings wherein:

FIG. 1 is a cross-sectional side view of a prior art high-force spring probe;

FIG. 2 is a cross-sectional side view of the prior art high-force spring probe of FIG. 1 shown with a spring partly in phantom lines;

FIG. 4 is a cross-sectional side view of a high-force spring probe constructed according to principles of this invention;

FIG. 5 is a cross-sectional side view of the high-force spring probe of FIG. 4 shown with a spring partly in phantom lines; and FIG. 6 is a cross sectional side view of a plunger member of the high-force spring probe of FIGS. 4 and 5 shown removed from the barrel of the probe.

DETAILED DESCRIPTION

Figure 3:
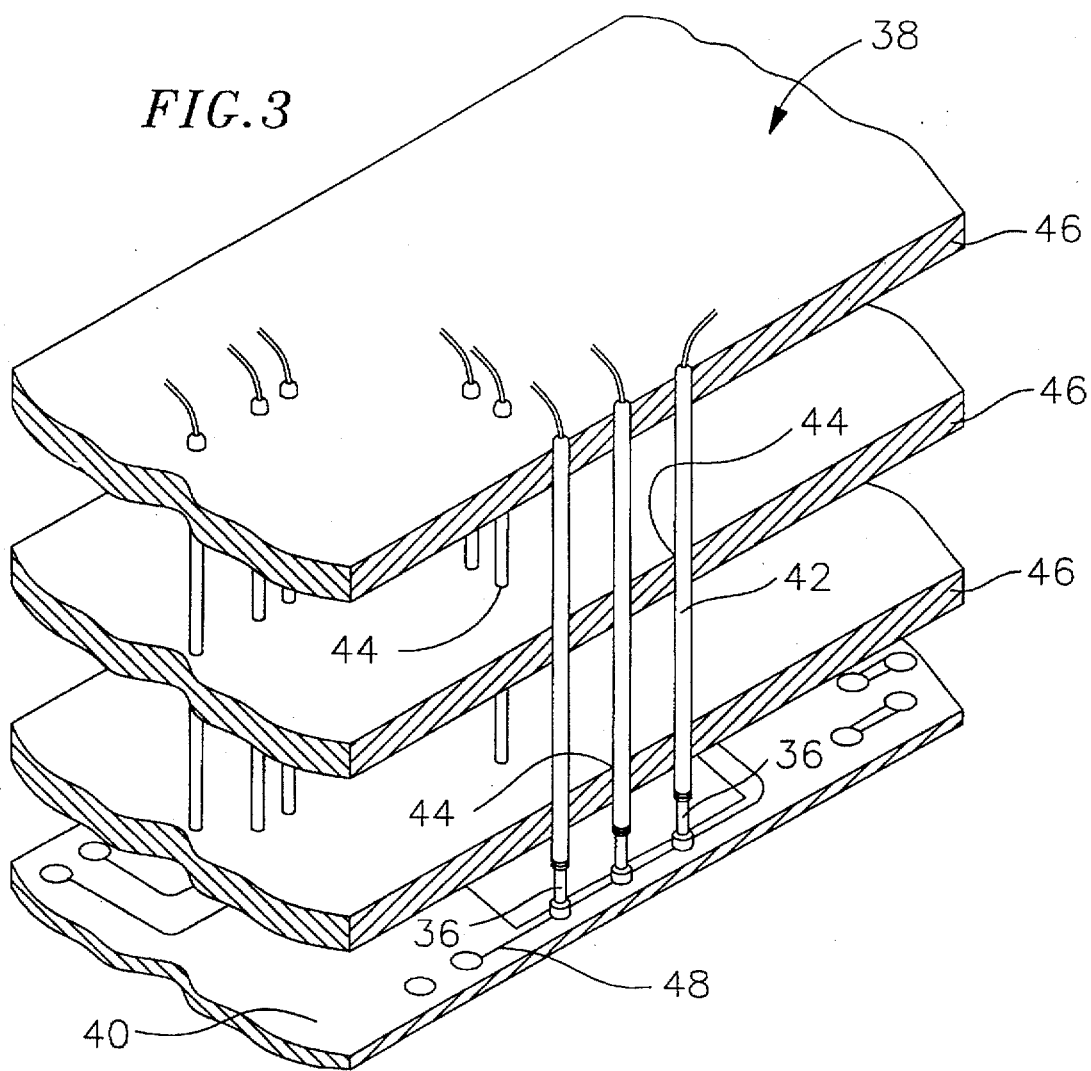
FIG. 3 is a semi-schematic perspective view of a test fixture comprising a plurality of probe receptacles containing high-force spring probes constructed according to principles of this invention.

FIGS. 1 and 2 illustrate a conventionally configured prior art high-force spring probe that is used to perform continuity and diagnostic electrical tests on an electrical device such as a printed circuit boards (PCB) and the like. The prior art spring probe 10 comprises a barrel 12 configured in the shape of a cylindrical tube having a partially-closed terminal end 14 and an open plunger end 16. A plunger 18 is partially disposed within the barrel and comprises a first radially extending bearing section 20 at one end 22 of the plunger. The plunger also includes a head or tip portion 24 at an opposite end. The head portion is configured to accommodate electrical contact with a PCB under test. The plunger 18 further comprises an elongated second bearing section 26 that extends axially from the head portion 24 toward first bearing section 20. The second bearing section 26 has a diameter equal to the diameter of the first bearing 20 section and defines the diameter of the plunger adjacent the head portion 24. Between the first and second bearing sections is an elongated intermediate section 28 of the plunger that has a uniform diameter smaller than the diameter of the first and second bearing sections. The sliding contact of the first and second bearing sections 20 and 26 against an inside diameter surface 30 of the barrel guides the plunger in its axial travel within the barrel upon contact of the plunger head portion with a PCB.

The plunger 18 is partially disposed within the barrel 12 such that the first bearing section 20 and a variable length of the second bearing section 26 are adjacent the inside diameter 30 of the barrel as the plunger reciprocates in and out of the barrel during use. The barrel includes a crimped portion 32 that extends a predetermined distance toward a center portion of the barrel and acts as a stop to retain the first bearing section 20 of the plunger 18 inside the barrel.

A coil spring 34 is disposed within the barrel 12 and is positioned between the partially-closed terminal end 14 of the barrel and the end portion 22 of the plunger. A ball 36 is disposed within the barrel between the partially-closed end 14 and an adjacent end portion of the spring 34. The bias of the spring against the plunger end 22 keeps the first bearing section 20 engaged against the crimped portion 32 of the barrel and, thus, keeps a portion of the plunger including the plunger head portion 24 extending outwardly away from the barrel. Upon contact by the head portion 24 against a PCB portion under test, the plunger slides axially into the barrel, causing plunger end portion 22 to travel toward the partially-closed terminal end 14 of the barrel and compresses the spring. The action of the spring resisting such compression imposes a simultaneous and opposite spring force on the PCB by the plunger head portion 24, thereby providing electrical contact under the mechanically applied spring contact between the plunger and the PCB.

FIG. 3 illustrates a number of high-force spring probes 36 constructed according to principles of this invention installed in a test fixture 38 used to perform continuity and diagnostic electrical tests on an electrical device 40 such as a printed circuit board or the like. The electrical device under test is commonly referred to as a unit under test, or a "UUT." The test fixture 38 comprises a plurality of elongated uniform diameter tubular probe receptacles 42 each mounted within holes 44 drilled in probe plates 46 that form the test fixture. The holes 44 are arranged in a predetermined pattern corresponding to electrical contacts 48 on the electrical device 40 under test. It is to be understood that the test fixture illustrated in FIG. 3 is simplified for purposes of reference and clarity, and that high-force spring probes constructed according to principles of this invention may be used with test fixtures configured other than that specifically described and illustrated.

FIG. 4 illustrates a high-force spring probe 50 as constructed according to principles of this invention comprising a barrel 52 configured having a circular cross section and generally uniform diameter from end to end forming a hollow interior 53 extending therethrough. In a preferred embodiment, the barrel has a length of approximately 24.6 millimeters (0.97 inches) and has a diameter of approximately 0.7 millimeters (0.03 inches). The barrel 52 has a partially closed terminal end 54 and an open plunger end 56. The barrel is made from an electrically conductive material such as copper, a metal alloy such as beryllium-copper, or the like. Additionally, the metal selected to form the barrel may be plated with a material having properties of enhanced electrical conductivity such as gold and the like to improve the electrical conductivity of the barrel, and thus, electrical conductivity of the probe.

A plunger 58 is partially disposed within the barrel 52 and comprises a head or tip portion 60 at an end portion that extends outside the barrel. In a preferred embodiment, the head portion has a length of approximately 2 millimeters (0.08 inches) and has a diameter of approximately 1.2 millimeters (0.047 inches). The plunger head or tip 60 may be headless and may have a number of different geometric configurations, such as single point, multiple point, concave and the like, depending on the particular configuration of the electrical contacts on the electrical device under test, that are designed to promote electrical contact with a PCB under test. The head portion 60 can be an integral or non-integral member of the plunger 58. In a preferred embodiment, the head portion is an integral plunger member.

The probe plunger 58 includes a bearing section 62 located at an intermediate position on the plunger. In a preferred embodiment, the bearing section 62 extends along the plunger a length of approximately 1.2 millimeters (0.046 inches). The bearing section 62 has an outside diameter that is approximately equal to an inside diameter 63 of the barrel to facilitate sliding travel of the bearing section on the inside barrel surface. In a preferred embodiment, the bearing section is an integral member of the plunger. An elongated intermediate section 64 of the probe plunger extends between the bearing section 62 and the head portion 60 of the plunger. The intermediate section has a diameter that is smaller than the bearing section and the plunger tip. In a preferred embodiment, the intermediate section 64 has a length of approximately 7.6 millimeters (0.3 inches) and has a diameter of approximately 0.8 millimeters (0.034 inches). The plunger is formed from an electrically conductive material such as copper, a metal alloy, such as beryllium-copper, or the like. Additionally, the material selected to form the plunger may be plated with a highly conductive material such as gold and the like to enhance electrical conductivity.

The barrel 52 includes one or more crimped portions 66 that extend radially into the barrel. The crimped portions 66 are located adjacent the plunger end 56 of the barrel and in use retain the plunger 58 in barrel by acting as a stop against axial displacement of the bearing section 62 within the barrel, when the bearing engages the crimps 66. The crimped portions 66 of the barrel have an inside diameter that is approximately equal to the diameter of the plunger intermediate section 64 to facilitate slidable axial displacement of the intermediate section 64 on the crimped portions 66. In a preferred embodiment, the barrel comprises two such crimped portions 66, wherein one crimped portion is positioned at the barrel open plunger end 56 and the other crimped portion is positioned approximately 12.7 millimeters (0.05 inches) from the open plunger end.

The sliding contact of the plunger bearing section 62 and plunger intermediate section 64 against the barrel inside diameter 63 and crimps 66, respectively, align and guide the plunger 56 within the barrel during axial displacement of the plunger therein. Referring to FIGS. 5 and 6, the plunger 56 further includes an elongated reduced diameter spring control section 68 that extends axially from the plunger bearing section 62 to an end portion 70 of the plunger located a substantial distance from the bearing 62. The long narrow spring control section is of uniform diameter and extends along the central axis of the barrel interior. In a preferred embodiment, the reduced diameter section has a length of approximately 11 millimeters (0.44 inches) and has a diameter of approximately 0.5 millimeters (0.02 inches). Thus, the long narrow spring control section of the plunger extends for about one-half the overall length of the plunger, with the bearing section located at about the central portion of the plunger. A tapered portion 72 of the plunger is positioned at a transition between the plunger bearing section 62 and the spring control section 68. In a preferred embodiment, the tapered portion has an angle of taper with respect to an axis running along the plunger of approximately 30 degrees. The plunger end portion 70 is also configured having a tapered shape. In a preferred embodiment, the end portion 70 has a tapered shape with an angle of taper of approximately 20 degrees with respect to the axis of the plunger.

Referring back to FIG. 4, an elongated coil spring 74 is disposed within the barrel interior 53 and is positioned on the spring control section 68 of the plunger between the tapered portion 72 of the plunger and the partially-closed terminal end 54 of the barrel. A ball 76 is interposed between the spring 74 and the terminal end 54. The spring control section 68 of the plunger extends along the inside of the spring 74. It is preferred that the spring have an inside diameter that is approximately equal to the diameter of the spring control section 68. The coil spring is made from an electrically conductive material such as metal, metal alloy and the like. It is desired that the spring have a length and a spring rate to provide a predetermined level of compression force to the plunger to both facilitate axial displacement of the plunger within the barrel and to impose a sufficient compression force between the head portion 60 and a PCB under test to ensure good electrical contact in a dirty environment.

In use, the spring biases the plunger 58 toward the plunger end 56 of the barrel so that an end of the bearing section 62 engages the crimped portion 66, thereby causing a the intermediate section 64 of the plunger and the head portion 60 to travel outwardly a selected distance from the end of the barrel. Upon contact of the head portion with a PCB under test the plunger 58 is axially displaced within the barrel, causing compression of the spring and producing in a resultant spring force on the PCB.

In a preferred embodiment, the coil spring 74 has a non-compressed or relaxed length outside of the barrel of approximately 21 millimeters (0.84 inches), has a spring rate in the range of from 2.5 to 5.0 lb/in., and has a wire diameter in the range of from 0.15 to 0.25 millimeters (0.006 to 0.01 inches). When installed within the barrel interior 53, the spring has a length of approximately 20 millimeters (0.79 inches) when the probe bearing section is engaged against the crimped barrel portion. Although particular physical characteristics have been disclosed, it is to be understood that the above-identified physical spring characteristics are those that are compatible with use in a high-force spring probe of the above-described dimension and that such dimensions and physical spring characteristics will change as the size of the spring probe changes. Additionally, it is also to be understood that the particular spring rate and wire size may be varied according to the particular application of the high-force spring probe. For example, a relatively low spring rate and/or wire size may be desired for testing a PCB that has a small thickness and is relatively fragile, or a relatively high spring rate and/or wire size may be desired for testing a PCB having a large thickness and/or having a high degree of impurities on the testing surface.

In a preferred embodiment, the clearance between the inside spring diameter and the spring control section 68 is in the range of from about 0.02 to 0.10 millimeters (0.001 to 0.004 inches). It is also desired that the outside spring diameter dimension be approximately similar to the inside diameter dimension of the barrel. The close tolerances between the spring control section 68 of the plunger and inside diameter of the spring, on the one hand, and the outside diameter of the spring and inside diameter of the barrel, on the other hand, act as a stable bearing to provide improved guidance and alignment of the plunger 58 during axial displacement within the barrel. The interaction between the plunger spring control section 68, spring 74, and barrel 52 provides a bearing-like mechanism having a surface area that exceeds by many times the surface area of the first bearing section 20 of the prior art probe (as shown in FIGS. 1 and 2) and, therefore, provides a higher degree of plunger stability. In the illustrated embodiment, for example, the length of this continuous bearing surface is approximately equal to the maximum length of plunger travel (from its fully extended to its fully retracted position).

The high-force spring probe constructed according to principles of this invention comprises three bearing-type mechanisms (i.e., interaction of the intermediate plunger section 64 and crimped barrel portions 66, interaction of the plunger bearing section 62 and the barrel inside diameter surface 63, and the interaction spring control section 68 of the plunger and the spring inside diameter/spring outside diameter and the barrel inside diameter surface 63), rather than the two bearing mechanisms disclosed by the prior art. As a result, the invention provides enhanced guidance and alignment of the plunger during axial displacement and, thereby minimize lateral deflection of the plunger and maximize pointing accuracy of the plunger.

The high-force spring probe constructed according to principles of this invention has been shown to have an improved total indicator reading ("TIR"), which is a measurement of the plunger tip eccentricity, i.e., the amount of lateral plunger tip movement with respect to the barrel. It is desired that a probe have a low TIR, i.e., the plunger tip have little or no lateral movement with respect to the barrel, to facilitate accurate placement of the plunger tip or head portion during the testing of a PCB. Accurate placement of the plunger tip is critical because of the increased circuit density on the PCB. Accordingly, a probe having a high TIR could result in an erroneous circuit test or short circuit due to the misplacement of the plunger head on an undesired electrical circuit.

The high-force probe constructed according to principles of this invention produces a spring force on a unit under test that is greater than the compression force of a conventional prior art high-force probe. For example, a conventional probe constructed as disclosed above and illustrated in FIGS. 1 and 2, includes a spring having a non-compressed length of approximately 12.7 millimeters (0.5 inches) and a wire diameter of 0.1 millimeters (0.0045 inches). Such a conventional probe produces a compression force of approximately 4.5 ounces. A high-force spring probe of this invention, of approximately the same overall dimension, may produce a compression force in the range of from about 10 to 16 ounces. For example, a high-force spring probe comprising a spring having a non-compressed length of approximately 22 millimeters (0.85 inches) and a wire diameter of approximately 0.21 millimeters (0.0085 inches) can produce a compression force of approximately 16 ounces. Accordingly, a high-force probe constructed according to this invention has a compression force of greater than three times that of a high-force spring probe of conventional design and, therefore, is more effective at establishing an electrical contact with a dirty PCB. Additionally, the high-force probe of this invention is more reliable than conventional high-force spring probes, having been tested in over 1,000,000 cycles without any indication of problem.

Although a particular embodiment of the high-force spring probe has been specifically described and illustrated, it is to be understood that other embodiments of the high-force spring probe are meant to be within the scope of this invention. For example, a preferred embodiment of the spring probe has been described having particular dimensions. It is to be understood that the dimensions provided were only illustrative of one size of the probe for a particular application, i.e., for testing a particular electrical device, and that high-force spring probes may be constructed according to principles of this invention having dimensions different from that described and illustrated to accommodate testing a variety of different electrical devices. Additionally, particular embodiments of the high-force spring probe have been illustrated having an enlarged head portion. This was done for purposes of clarity and reference only and is not meant to be limiting, as high-force spring probes constructed according to principles of this invention may comprise a non-enlarged or headless tip portion.

Although a preferred embodiment of a high-force spring probe has been specifically described and illustrated, it is to be understood that variations or alternative embodiments apparent to those skilled in the art are within the scope of this invention. Since many such variations may be made, it is to be understood that within the scope of the following claims, this invention may be practiced otherwise than specifically described.

What is claimed is:

1. A high-force spring probe comprising:
   a tubular barrel having a hollow interior, a plunger end at one end of the barrel, and a terminal end at an opposite end of the barrel;
   a plunger disposed within the barrel interior, the plunger including:
      a bearing section disposed immediately inside the plunger end of the barrel and having an outside diameter approximately matching an inside diameter of the barrel; and
      an elongated spring control section disposed within the barrel, the elongated spring control section extending axially away from the bearing section to a free end of the plunger;
   a plunger control spring disposed within a major length of the barrel interior and positioned between the plunger bearing section and the terminal end of the barrel;
   wherein the elongated spring control section is disposed within the spring and has an axial length that is approximately one-half of the total spring length when the plunger is in a non-retracted state within the barrel to align and guide the plunger during its axial displacement within the barrel.

2. The high-force spring probe as recited in claim 1 further comprising means for maintaining the bearing section of the plunger within the barrel.

3. The high-force spring probe as recited in claim 2 wherein the means for maintaining the bearing section of the plunger within the barrel comprises at least one crimped portion of the barrel adjacent the plunger end of the barrel, wherein the crimped barrel portion extends a distance into the barrel interior, and wherein the crimped portion has an inside diameter less than an outside diameter of the bearing section.

4. The high-force spring probe as recited in claim 3 wherein the plunger comprises an elongated intermediate section adjacent the bearing section that extends axially outwardly away from the plunger end, wherein the intermediate section has a diameter approximately matching the inside diameter of the crimped barrel portion to facilitate slidable axial movement therein.

5. The high-force spring probe as recited in claim 1 wherein the spring control section has a diameter smaller than a diameter of the bearing section.

6. The high-force spring probe as recited in claim 5 wherein the spring control section has a diameter less than an inside diameter of the spring, and the spring has an outside diameter less than an inside diameter of the barrel interior, and wherein the clearance between the spring control section and the spring inside diameter and between spring outside diameter and the barrel interior is each in the range of from about 0.02 to 0.1 millimeters.

7. The high-force spring probe as recited in claim 1 wherein the spring occupies greater than about 75 percent of the length of the barrel when the plunger is in a non-retracted state within the barrel.

8. The high-force spring probe as recited in claim 1 wherein maximum axial plunger travel within the barrel is defined by contact made between the terminal end of the barrel and the free end of the spring control section.

9. The high-force spring probe as recited in claim 8 wherein the maximum axial plunger travel is equal to about one-half of the total spring length when the plunger is in a non-retracted state.

10. A spring probe for performing tests on an electrical device, the spring probe comprising:
    a tubular barrel having a hollow interior with a plunger end at one end of the barrel and a terminal end at an opposite end of the barrel;
    a plunger slidably disposed within the barrel plunger end, wherein the plunger comprises:
        a tip portion at one end of the plunger that extends outwardly away from the barrel plunger end;
        a bearing section that extends radially outward a distance from the plunger and is positioned axially a distance away from the tip portion, the bearing portion being disposed within the interior of the barrel; and
        an elongated spring control section that extends axially away from the bearing section within the interior of the barrel, the spring control section having a free end; and
    a control spring disposed axially within the interior of the barrel between the barrel terminal end and the bearing section of the plunger, the control spring occupying a major length of the barrel interior when the plunger is in a non-retracted state within the barrel;
    wherein the spring control section is disposed axially within the spring and has an axial length that is approximately one-half the length of the spring when the plunger is in a non-retracted state to provide enhanced plunger guidance and axial alignment during slidable movement of the plunger within the barrel;
    wherein the free end of the spring control section is not connected to the barrel when the plunger is in a non-retracted state within the barrel; and
    wherein maximum axial plunger travel within the barrel is defined by a distance between the terminal end of the barrel and the free end of the spring control section and is approximately one-half of the spring length when the spring is in a non-retracted state within the barrel.

11. The spring probe as recited in claim 10 wherein the barrel includes at least one crimped portion adjacent a plunger end that extends radially a distance into the barrel interior.

12. The spring probe as recited in claim 11 wherein the plunger includes an elongated intermediate section between the tip portion and the bearing section that has a diameter approximately matching a diameter of the interior of the barrel at the crimped portion to accommodate slidable axial displacement of the intermediate section therein.

13. The spring probe as recited in claim 10 wherein the bearing section of the plunger has a diameter approximately matching an inside diameter of the barrel interior to facilitate slidable axial displacement of the bearing section therein, and wherein the bearing section has a diameter greater than the intermediate section of the plunger.

14. The high-force spring probe as recited in claim 10 wherein the spring control section has a diameter less than an inside diameter of the spring, and the spring has an outside diameter less than an inside diameter of the barrel interior, and wherein the clearance between the spring control section and the spring inside diameter and between spring outside diameter and the barrel interior is each in the range of from about 0.02 to 0.1 millimeters.

15. The spring probe as recited in claim 10 wherein the spring control section of the plunger has a surface area that is greater than a surface area of the bearing section of the plunger.

16. The spring probe as recited in claim 10 wherein the spring occupies greater than 75 percent of the length of the barrel interior when the plunger is in a non-retracted state within the barrel.

17. A high-force spring probe for use in testing an electrical device, the probe comprising:
    a barrel having a plunger end, a terminal end, and having a hollow interior extending therebetween;
    a plunger disposed partially within the barrel interior and capable of slidable axial travel therein, the plunger comprising:
        a tip portion at one end is disposed outside of the barrel and extends axially away from the barrel plunger end;
        a bearing section disposed within the barrel interior, the bearing section being positioned at an axial midpoint of the plunger and extending radially outward a distance from the plunger; and
        an elongated spring control section disposed axially within the barrel interior and positioned adjacent the bearing section, the spring control section extending axially away from the bearing section to define a free end of the plunger;
    means depending from the barrel for maintaining the bearing section and spring control section of the plunger displaced within the barrel interior; and
    a spring disposed axially within the barrel interior between the terminal end of the barrel and the bearing section of the plunger;
    wherein the spring control section of the plunger is disposed within an inside diameter of the spring so that at least one-quarter of the spring length remains unoccupied by the spring control section when the plunger is in a non-retracted state within the barrel to provide enhanced plunger guidance and axial alignment during slidable movement of the plunger within the barrel;

wherein a free end of the spring control section does not contact the barrel when the plunger is in a non-retracted state within the barrel; and wherein maximum axial plunger travel within the barrel is defined by a distance between the terminal end of the barrel and the free end of the spring control section and equals at least one-quarter of the spring length when the spring is in a non-retracted state within the barrel.

18. The high-force spring probe as recited in claim 17, wherein the spring control section has an axial length that occupies approximately one-half of the spring length when the spring is in a non-retracted state within the barrel.

19. The high-force spring probe as recited in claim 17 wherein the means for maintaining the bearing section and spring control section of the plunger disposed within the barrel interior comprises at least one crimped barrel portion adjacent the plunger end that extends a distance into the barrel interior.

20. The high-force spring probe as recited in claim 17 wherein the plunger comprises an elongated intermediate section extending axially between the tip portion and the bearing section, and wherein the intermediate section has a diameter less than a diameter of the bearing section and approximately matching an inside diameter of the crimped barrel portion to facilitate slidable axial movement of the intermediate section therein.

21. The high-force spring probe as recited in claim 20 wherein the spring control section has a diameter less than an inside diameter of the spring, and the spring has an outside diameter less than an inside diameter of the barrel interior, and wherein the clearance between the spring control section and the spring inside diameter and between spring outside diameter and the barrel interior is each in the range of from about 0.02 to 0.1 millimeters.

22. The high-force spring probe as recited in claim 21 wherein the spring occupies greater than 75 percent of the length of the barrel interior when the plunger is in a non-retracted state within the barrel.

* * * * *